(12) United States Patent
Kondo

(10) Patent No.: US 7,755,126 B2
(45) Date of Patent: Jul. 13, 2010

(54) MEMORY DEVICE CONFIGURED TO HAVE TRANSISTOR AND CAPACITOR

(75) Inventor: Hiroshi Kondo, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 28 days.

(21) Appl. No.: 12/146,749

(22) Filed: Jun. 26, 2008

(65) Prior Publication Data

US 2009/0001436 A1    Jan. 1, 2009

(30) Foreign Application Priority Data

Jun. 29, 2007   (JP) .............................. 2007-172832

(51) Int. Cl.
*H01L 29/94* (2006.01)
(52) U.S. Cl. ................. 257/296; 257/E29.345
(58) Field of Classification Search ................ 257/296, 257/2, 4, 330, E29.345
See application file for complete search history.

(56) References Cited

U.S. PATENT DOCUMENTS

| 6,346,730 | B1 * | 2/2002 | Kitakado et al. ............. 257/350 |
| 6,762,443 | B2 | 7/2004 | Weis |
| 7,504,303 | B2 * | 3/2009 | Yilmaz et al. ................ 438/259 |
| 2005/0253188 | A1 * | 11/2005 | Kito ............................ 257/330 |
| 2007/0040214 | A1 * | 2/2007 | Zeng ........................... 257/330 |
| 2009/0230465 | A1 * | 9/2009 | Yilmaz et al. ................ 257/330 |

FOREIGN PATENT DOCUMENTS

| JP | 7-321332 | 12/1995 |
| JP | 3321788 | 6/2002 |
| JP | 2003-258336 | 9/2003 |
| JP | 2003-533883 | 11/2003 |
| JP | 2005-229101 A | 8/2005 |
| JP | 2006-120810 | 5/2006 |

OTHER PUBLICATIONS

Basic course for VLSI technology (p. 37) written by Tadashi Shibata, Published by Heibonsha Limited, Publishers, pp. 36-39 (with English Translation).
Fujitsu semiconductor device Memory Manual Fram guide book, pp. 12-13 ( with English Translation).

* cited by examiner

*Primary Examiner*—Nathan W Ha
(74) *Attorney, Agent, or Firm*—Oblon, Spivak, McClelland, Maier & Neustadt, L.L.P.

(57) ABSTRACT

Disclosed is a memory device having a transistor, the transistor including a substrate; a gate electrode formed on the substrate; an insulation layer formed on the gate electrode, the gate electrode and the insulation layer forming a convex portion; a conductive layer formed at a top of the convex portion; a source electrode formed on one side of the convex portion on the substrate; a drain electrode formed on the other side of the convex portion on the substrate where the source electrode is not formed; and a semiconductor layer formed on the insulation layer existing between the conductive layer and the source electrode and between the conductive layer and the drain electrode.

8 Claims, 17 Drawing Sheets

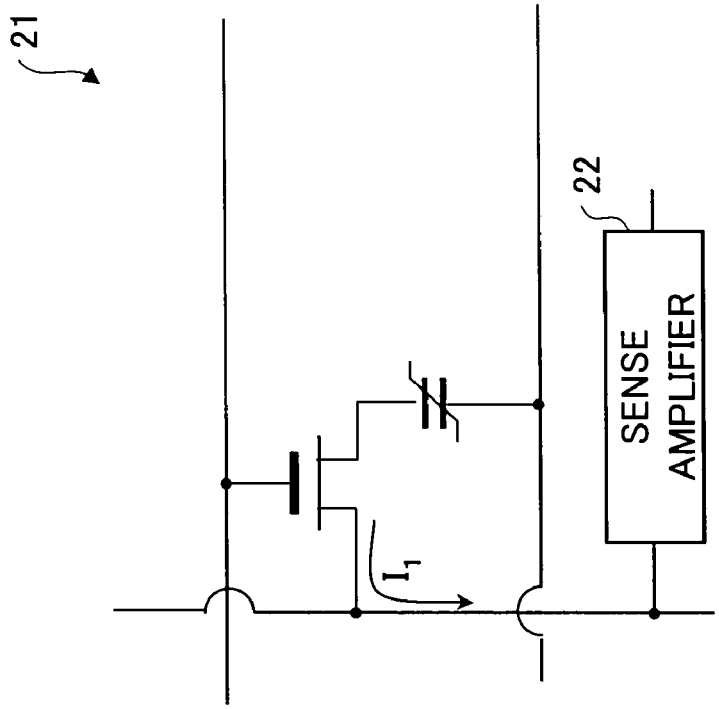
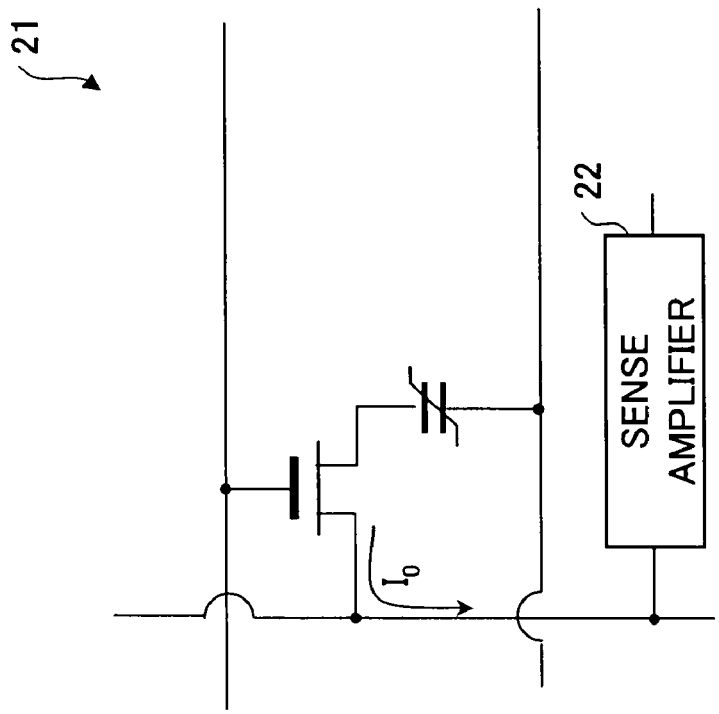
FIG.3B
FIG.3A

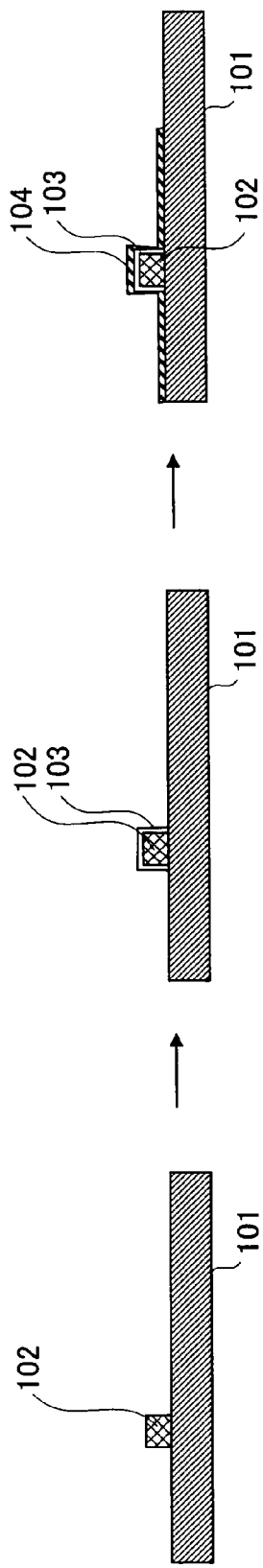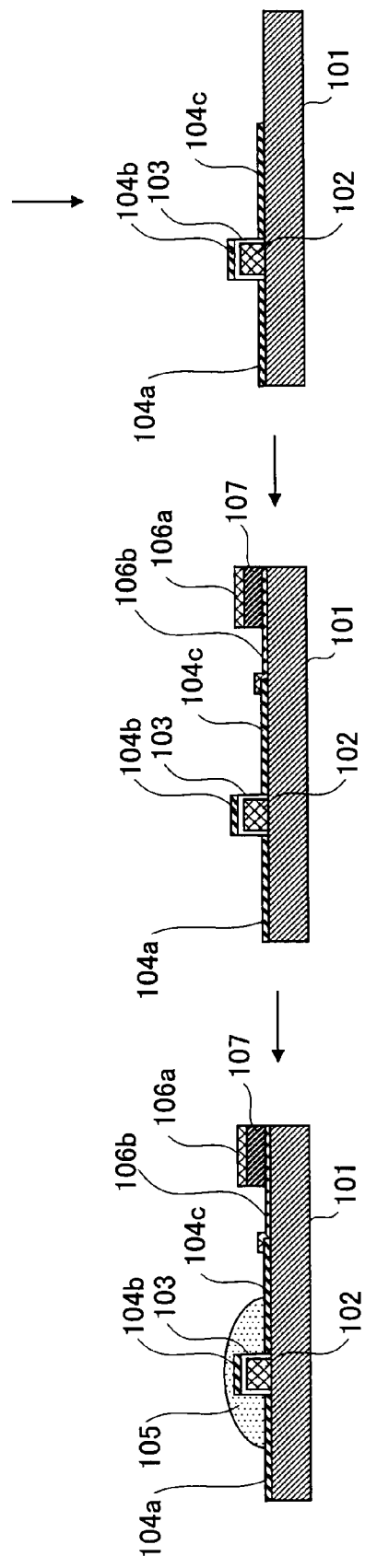

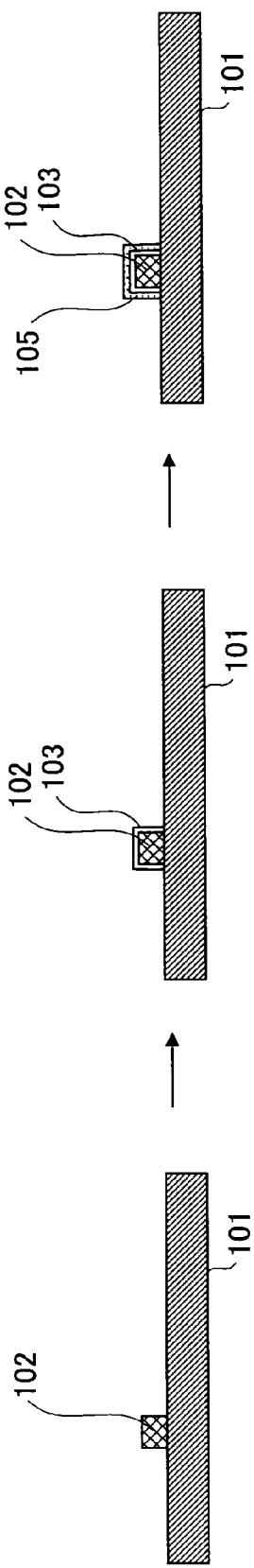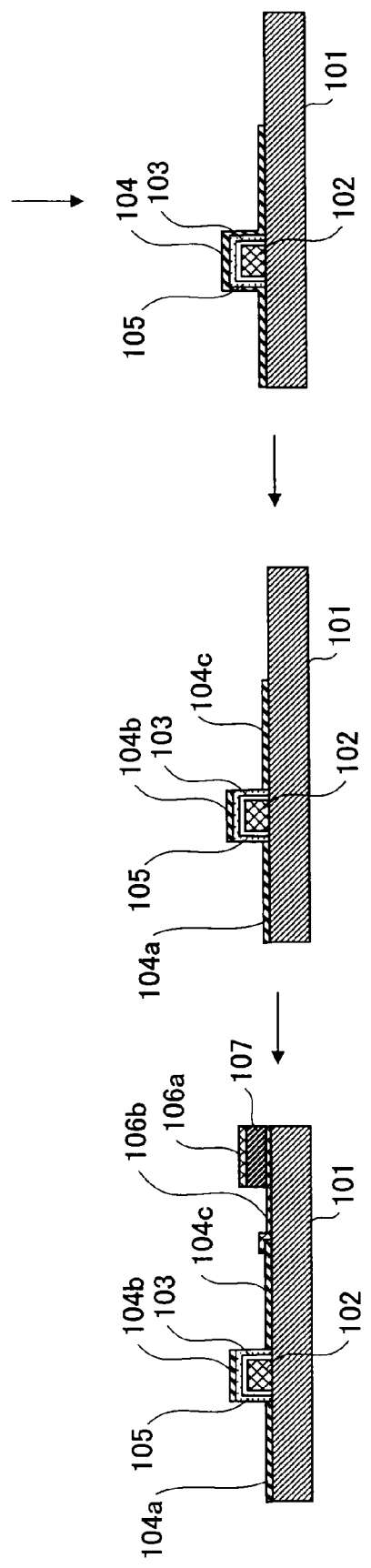

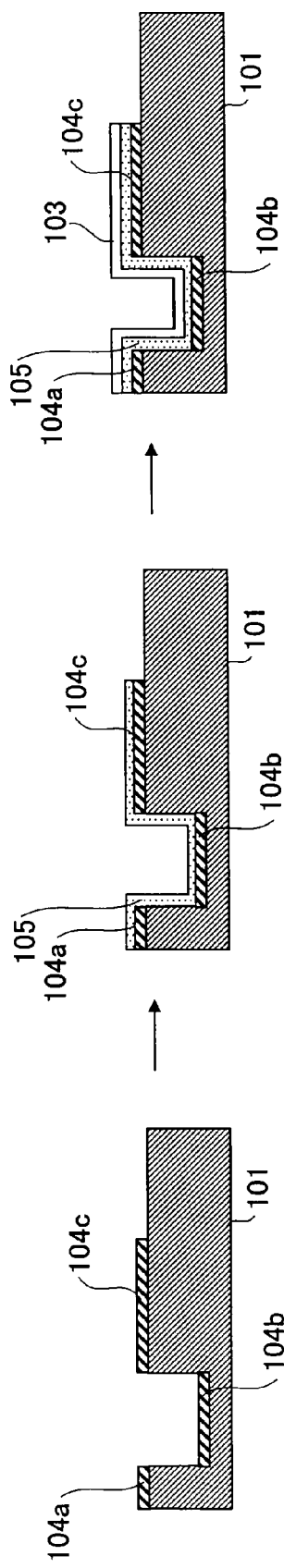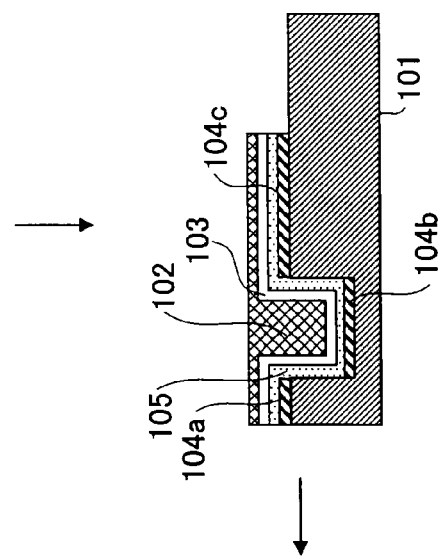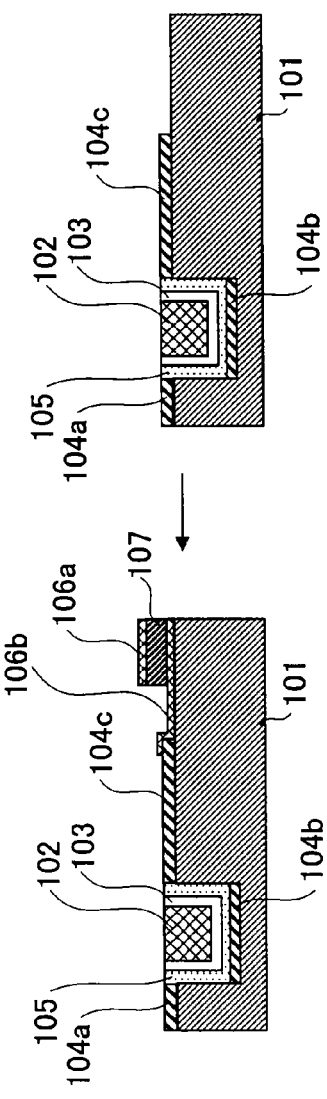

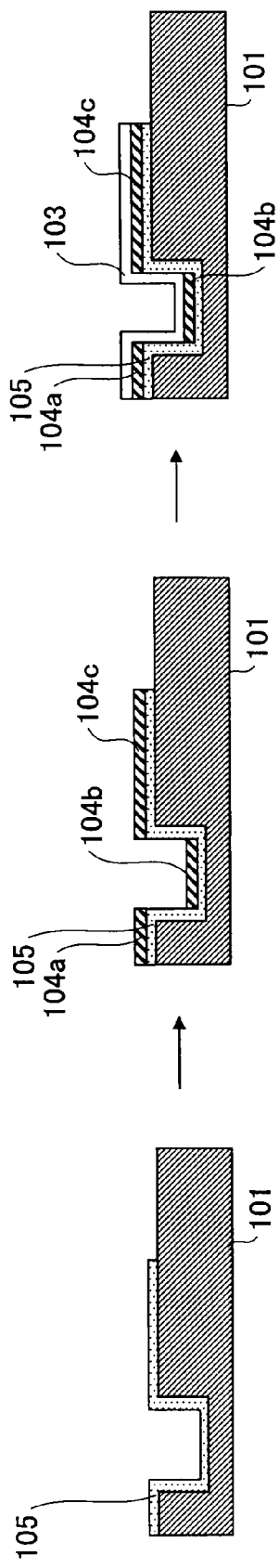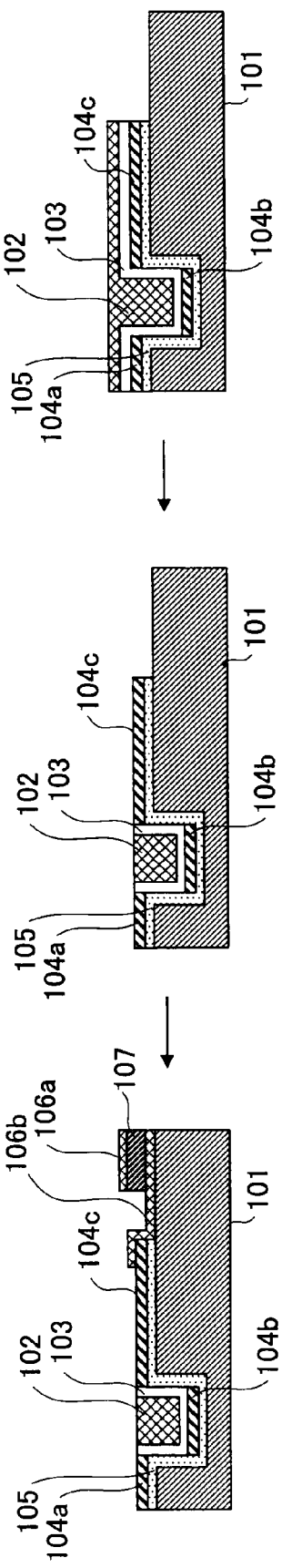

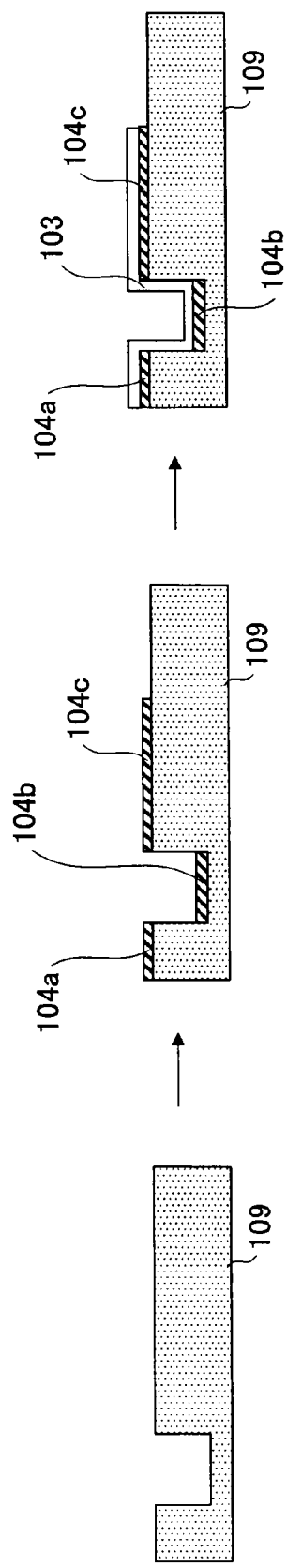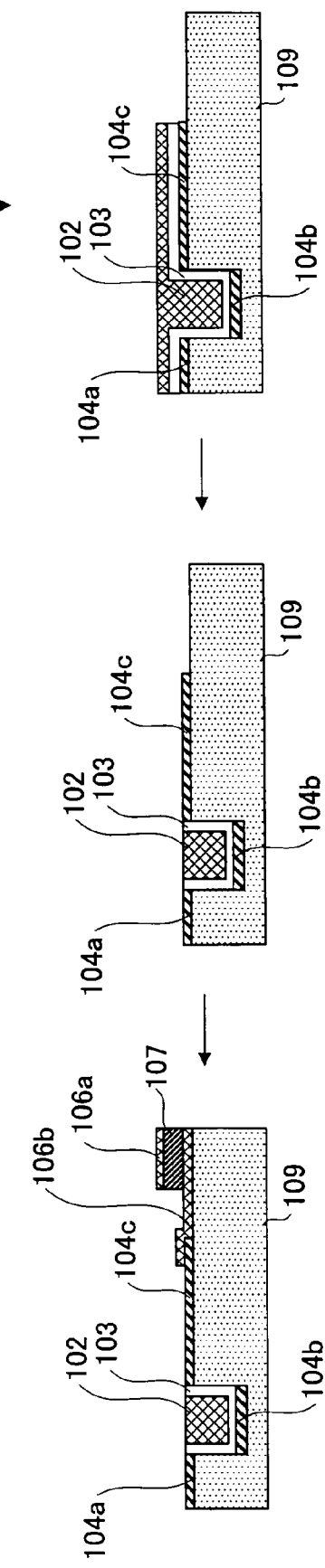

MEMORY DEVICE CONFIGURED TO HAVE TRANSISTOR AND CAPACITOR

BACKGROUND OF THE INVENTION

1. Field of the Invention

The present invention relates to a memory device.

2. Description of the Related Art

As memory devices, volatile memory devices (e.g., a SRAM, a DRAM, etc.) and non-volatile memory devices (e.g., an EEPROM, a FRAM, a PRAM, a ReRAM, a MRAM, etc.) are known. Among these memory devices, the DRAM and the FRAM include as a minimum configuration unit (memory cell) a transistor and a capacitor having a general structure, and the PRAM, the ReRAM, and the MRAM generally include as a minimum configuration unit a transistor and an element whose electric resistance is changed with the application of voltage. Therefore, these memory devices can be manufactured with a simple circuit configuration.

FIG. 1 shows a configuration of the memory cell of the DRAM. In the following, writing of data, refresh, and reading of data in a memory cell 11 are described.

(1) Writing of Data

When voltage is applied to a word line 11a and a select transistor 11b is turned on, charges are accumulated in a paraelectric capacitor 11c and data element "1" is written in the memory cell 11. On the other hand, when voltage is not applied to the word line 11a and the select transistor 11b is turned off, charges are not accumulated in the paraelectric capacitor 11c and data "0" element is written in the memory cell 11. At this time, because the charges accumulated in the paraelectric capacitor 11c decrease with time and become zero, it is necessary to refresh the memory cell 11.

(2) Refresh

The refresh refers to writing at a predetermined time interval with respect to the memory cell 11 in which the data element "1" has been written. Note that a dummy cell 12 is connected to a dummy capacitor 12c whose capacity is half the size of the paraelectric capacitor 11c, and it generally has no charges accumulated therein.

(3) Reading of Data

In a case where the data element "1" is written in the memory cell 11, more than half charges are held even if a small amount of time passes. Accordingly, when voltage is applied to the word lines 11a and 12a and the select transistor 11b and a dummy transistor 12b are turned on, charges are accumulated in the paraelectric capacitor 11c and the dummy capacitor 12c. However, many charges are moved by the dummy capacitor 12c. A sense amplifier 13, which is connected to the memory cell 11 and the dummy cell 12 via bit lines 11d and 12d, detects the movement of the charges and determines that the data element "1" has been written in the memory cell 11. As a result, the data element "1" is read. At this time, the charges accumulated in the dummy capacitor 12c are promptly reduced to zero.

Furthermore, in a case where the data element "0" is written in the memory cell 11, when the select transistor 11b and the dummy transistor 12b are turned on, many charges are moved by the paraelectric capacitor 11c. The sense amplifier 13 detects the movement of the charges and determines that the data element "0" has been written in the memory cell 11. As a result, the data element "0" is read. At this time, the charges accumulated in the paraelectric capacitor 11c and the dummy capacitor 12c are promptly reduced to zero.

As described above, the DRAM is a memory that holds data only when voltage is being applied, and it is called a volatile memory.

FIG. 2 shows a configuration of the cell of the FRAM. Next, the writing and the reading of data in the cell are described.

(1) Writing of Data

When voltage is applied to a bit line 21a, a word line 21b, and a plate line 21c in the order ($t_1 < t_2 < t_3$) shown in table 1, the data element "0" is written in a cell 21. In other words, in $t_2$, the data element "0" refers to where the voltage of a ferroelectric capacitor 21d on the side of a transistor 21e is lower than that on the side of the plate line 21c. Then, even if the power is turned off ($t_3$), charges are accumulated in the ferroelectric capacitor 21d to hold data therein. Therefore, a non-volatile memory is provided.

TABLE 1

|  | $t_1$ | $t_2$ | $t_3$ |
| --- | --- | --- | --- |
| VOLTAGE APPLIED TO BIT LINE[V] | 0 | 0 | 0 |
| VOLTAGE APPLIED TO WORD LINE | ON | ON | OFF |
| VOLTAGE APPLIED TO PLATE LINE[V] | 0 | $V_{CC}$ | 0 |

Furthermore, when voltage is applied to the bit line 21a, the word line 21b, and the plate line 21c in the order shown in table 2, the data element "1" is written in the cell 21. In other words, in $t_2$, the data element "1" refers to where the voltage of the ferroelectric capacitor 21d on the side of the transistor 21e is higher than that on the side of the plate line 21c.

TABLE 2

|  | $t_1$ | $t_2$ | $t_3$ |
| --- | --- | --- | --- |
| VOLTAGE APPLIED TO BIT LINE[V] | 0 | $V_{CC}$ | 0 |
| VOLTAGE APPLIED TO WORD LINE | ON | ON | OFF |
| VOLTAGE APPLIED TO PLATE LINE[V] | 0 | 0 | 0 |

(2) Reading of Data

First, after the voltage 0 V is applied to the bit line 21a and the word line 21b is turned on, $V_{cc}$ is applied to the plate line 21c. In a case where the data element "0" has been written in the cell 21, the movement $I_0$ of charges shown in FIG. 3A causes the bit line 21a to be charged up to $V_0$. Furthermore, in a case where the data element "1" has been written in the cell 21, the movement $I_1$ of charges greater than $I_0$ as shown in FIG. 3B causes the bit line 21a to be charged up to $V_1$. Here, a sense amplifier 22 having an intermediate potential $V_{ref}$ between $V_1$ and $V_0$ is connected to the bit line 21a. When a potential is greater than $V_{ref}$, the sense amplifier amplifies it up to $V_{cc}$ and reads the same as the data element "1." Also, when the potential is smaller than $V_{ref}$, the amplifier recognizes it as 0 V and reads the same as the data element "0."

Furthermore, even if the capacitor connected to the memory cell in the DRAM is replaced by an element whose electric resistance is changed with the application of voltage, the DRAM serves as a memory device. If the element is capable of holding the electric resistance, the DRAM serves as a non-volatile memory similar to the FRAM.

As a non-volatile memory of this type, a phase-change memory (PRAM) is provided (see Patent Document 1).

FIG. 4 shows the memory cell of the PRAM. A phase-change material 41a can change its phase into either a polycrystalline state or an amorphous state. In the case of the amorphous state, current passing through the phase-change material 41a becomes small, which is set as "0." Furthermore, the phase-change material 41a turns to the polycrystalline state when it is supplied with a relatively small current and held at a crystallization temperature below its melting point in the amorphous state. At this time, the current passing through the phase-change material 41a becomes large, which is set as "1." On the other hand, the phase-change material 41a turns to the amorphous state when it is rapidly cooled after being supplied with a relatively large current and melted. Generally, the phase change from the amorphous state to the polycrystalline state takes more time than that from the polycrystalline state to the amorphous state, but it is controlled by the length of pulse voltage to be applied. The principle of operation using such a function of changing and holding an electric resistance is also applicable to the ReRAM and the MRAM as other non-volatile memory devices. Here, instead of using the phase-change material of the PRAM, the ReRAM is generally made of a transistor and an element holding either the insulation body or the semiconductor of a transition metal oxide between electrodes, and the MRAM is made of a magnetic tunnel junction element and a transistor. Among these non-volatile memories, the PRAM is expected to become a non-volatile memory device for facilitating high integration.

FIG. 5 shows a general structure of a (planar-type) transistor. The transistor 50 has a gate electrode 52, a gate insulation film 53, a source electrode 54a, a drain electrode 54b, and a semiconductor layer 55 laminated on a substrate 51 one upon another.

Recently and continuing, attention is given to organic TFTs from the viewpoint of cost reduction in various electronic devices such as displays and IC tags. In order to put such electronic devices to practical use, it is necessary to ensure an operating speed satisfying the practical use. However, because the carrier mobility μ of organic semiconductors is generally much smaller than that of silicon semiconductors, it is difficult for the organic semiconductors to respond at high speed. The relationship between a cutoff frequency $f_c$ as an index of a TFT operating speed, a mutual conductance $g_m$, and a gate capacity $C_g$ is expressed by a formula $f_c \propto g_m/C_g$, wherein $C_g$ is proportional to the gate electrode 52, the gate overlap D formed between the source electrode 54a and the drain electrode 54b, and the channel length L. In addition, because $g_m$ is generally proportional to μ/L, it is necessary to reduce L and D as a device structure so as to improve $f_c$. However, in order to make L several μm or smaller and perform patterning on the source electrode 54a and the drain electrode 54b, it is generally necessary to undergo complicated processes and install expensive manufacturing apparatuses, resulting in an increase in manufacturing costs. Furthermore, where the substrate 51 is likely to contract like a resin film in particular, the larger the areas of the gate electrode 52, the source electrode 54a, and the drain electrode 54b are, the more difficult it is for the gate electrode 52, the source electrode 54a, and the drain electrode 54b to be aligned so as to be almost not overlapped with each other. In the case of a silicon TFT, the gate electrode 52 on which minute patterning is performed using photolithography is generally used as a mask and an ion injection process is used to perform self-alignment to make the gate overlap D as small as possible. However, this results in an increase in manufacturing costs. Accordingly, it is difficult to manufacture a high-speed TFT at low cost. That is, it is difficult to manufacture a memory device capable of operating at high speed.

Moreover, when the DRAM is refreshed and the data of the FRAM are read in a case where a transistor is applied to a memory device, the data element "1" or the data element "0" is determined according to the amount of charges accumulated in a capacitor connected to the transistor relative to a predetermined reference value. As shown in FIG. 6, on the other hand, a transistor 60 having the gate overlap D includes parasitic capacities 63a between a gate electrode 61 and source and drain electrodes 62a and 62b. When the transistor 60 is applied to a memory device, the parasitic capacity 63 is charged as soon as a word line is turned on at the time of the refresh and the reading of data. Accordingly, in the case of the DRAM shown in FIG. 1, the balance between the capacity of the paraelectric capacitor 11c and that of the dummy capacitor 12c is lost, which may cause a reading error between the data element "0" and the data element "1" at the time of the refresh, thus increasing an error rate. Furthermore, because the charges in the parasitic capacity 63 pass in the case of the FRAM shown in FIGS. 3A and 3B, the movement of current greater than $I_0$ is caused to occur at the time of reading the data element "0," which may cause a reading error between the data element "0" and the data element "1," thus increasing an error rate. Moreover, the data element "0" and the data element "1" are determined according to the amount of the current accompanied by a change in electric resistance as in the case of the PRAM shown in FIG. 4. Therefore, when the charges in the parasitic capacity 63 are detected as current, a reading error between the data element "0" as the data element "1" may be caused, thus increasing an error rate.

Non-Patent Document 1: "Basic course for VLSI technology" (P37) written by Tadashi Shibata, published by Heibonsha Limited, Publishers Non-Patent Document 2: "Fujitsu semiconductor device MEMORY MANUAL FRAM guide book" (P20 to P21)

Patent Document 1: JP-A-2006-120810

SUMMARY OF THE INVENTION

In view of the above drawbacks, the present invention may provide a memory device capable of achieving a low error rate, responding at high speed, and being manufactured at low cost.

According to a first aspect of the present invention, a memory device having a transistor is provided. The transistor includes a substrate; a gate electrode formed on the substrate; an insulation layer formed on the gate electrode, the gate electrode and the insulation layer forming a convex portion; a conductive layer formed at a top of the convex portion; a source electrode formed on one side of the convex portion on the substrate; a drain electrode formed on the other side of the convex portion on the substrate where the source electrode is not formed; and a semiconductor layer formed on the insulation layer existing between the conductive layer and the source electrode and between the conductive layer and the drain electrode.

According to a second aspect of the present invention, a memory device having a transistor is provided. The transistor includes a substrate; a gate electrode formed on the substrate; an insulation layer formed on the gate electrode; a semiconductor layer formed in the insulation layer, the insulation layer and the semiconductor layer being laminated one upon the other to form a convex portion covering the gate electrode; a conductive layer formed at a top of the convex portion; a source electrode formed on one side of the convex portion on the substrate; and a drain electrode formed on the other side of the convex portion on the substrate where the source electrode is not formed.

According to a third aspect of the present invention, a memory device having a transistor is provided. The transistor includes a substrate; a concave portion formed in the substrate; a source electrode formed on one side of the concave portion on the substrate; a drain electrode formed on the other side of the concave portion on the substrate where the source electrode is not formed; a conductive layer formed at a bottom of the concave portion; a semiconductor layer formed in the conductive layer; an insulation layer formed on the semiconductor layer; and a gate electrode formed on the insulation layer. The semiconductor layer, the insulation layer, and the gate electrode are laminated one upon another to cover the concave portion having the conductive layer.

According to a fourth aspect of the present invention, a memory device having a transistor is provided. The transistor includes a substrate; a concave portion formed in the substrate; a source electrode formed on one side of the concave portion on the substrate; a drain electrode formed on the other side of the concave portion on the substrate where the source electrode is not formed; a semiconductor layer covering the concave portion; a conductive layer formed at a bottom of the semiconductor layer; an insulation layer formed on the conductive layer; and a gate electrode formed on the insulation layer. The insulation layer and the gate electrode are laminated one upon the other to cover the semiconductor layer having the conductive layer.

According to a fifth aspect of the present invention, a memory device having a transistor is provided. The transistor includes a semiconductor substrate; a concave portion formed in the semiconductor substrate; a source electrode formed on one side of the concave portion on the semiconductor substrate; a drain electrode formed on the other side of the concave portion on the semiconductor substrate where the source electrode is not formed; a conductive layer formed at a bottom of the concave portion; an insulation layer formed on the conductive layer; and a gate electrode formed on the insulation layer. The insulation layer and the gate electrode are laminated one upon the other to cover the concave portion having the conductive layer.

Preferably, the memory device described above may further include a capacitor having a dielectric body.

Preferably, the dielectric body may be a ferroelectric.

Preferably, the dielectric body may be a paraelectric.

Preferably, the memory device described above may further include an element whose electric resistance is changed with an application of voltage.

Preferably, the element whose electric resistance is changed with the application of voltage may have a phase-change material.

According to embodiments of the present invention, it is possible to provide a memory device capable of achieving a low error rate, responding at high speed, and being manufactured at low cost.

Other objects, features and advantages of the present invention will become more apparent from the following detailed description when read in conjunction with the accompanying drawings.

BRIEF DESCRIPTION OF THE DRAWINGS

FIGS. 3A and 3B explain the reading of data in the cell of the FRAM;

FIGS. 8A through 8F show a method of manufacturing the memory device in FIG. 7;

FIGS. 11A through 11F show a method of manufacturing the memory device in FIG. 10;

FIGS. 14A through 14F show a method of manufacturing the memory device in FIG. 13;

FIGS. 16A through 16F show a method of manufacturing the memory device in FIG. 15;

FIGS. 18A through 18F show a method of manufacturing the memory device in FIG. 17;

DETAILED DESCRIPTION OF THE PREFERRED EMBODIMENTS

Referring to the accompanying drawings, a description is made of the best mode for carrying out the present invention.

Figure 7:
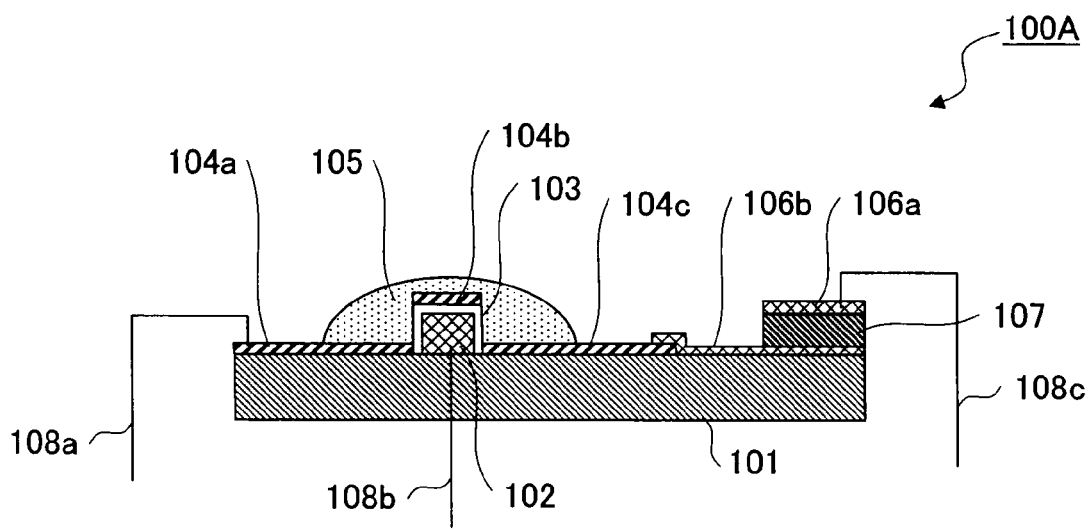
FIG. 7 shows a first embodiment of a memory device according to the present invention.

FIG. 7 shows a first embodiment of a memory device according to the present invention. The memory device 100A has a convex portion formed by covering the front surface of a gate electrode 102 with an insulation layer 103. Also, an electrode pattern is formed in an area including the convex portion on a substrate 101, and the bump of the convex portion divides the electrode pattern into a conductive layer 104$b$ formed at the top of the convex portion, and a source electrode 104$a$ and a drain electrode 104$c$ formed one on each side of the convex portion. Note that the source electrode 104$a$, the conductive layer 104$b$, and the drain electrode 104$c$ are electrode layers that are formed separately and each constitutes an independent area. Furthermore, a semiconductor layer 105 is formed on the insulation layer 103 existing between the source electrode 104$a$ and the conductive layer 104$b$ and between the conductive layer 104$b$ and the drain electrode 104$c$, which are divided by the bump of the convex portion. The memory device 100A includes a transistor having the above configuration and a capacitor having a dielectric body 107 held between an upper electrode 106$a$ and a lower electrode 106$b$. Accordingly, the memory device capable of achieving a low error rate, responding at high speed, and being manufactured at low cost can be provided.

Note that the gate electrode 102, the source electrode 104$a$ and the drain electrode 104$c$, and the upper electrode 106$a$ and the lower electrode 106$b$ are connected to a word line 108$b$, a bit line 108$a$, and a plate line 108$c$, respectively, and the plate line 108$c$ is given a fixed potential or driven by a pulse. Furthermore, the drain electrode 104c and the lower electrode 106b may be integrally molded.

In forming the gate electrode 102, the source electrode 104a, the conductive layer 104b, and the drain electrode 104c, examples of materials of the gate electrode 102, the source electrode 104a, the conductive layer 104b, and the drain electrode 104c can include conductive materials including metals such as chromium (Cr), tantalum (Ta), titanium (Ti), copper (Cu), aluminum (Al), molybdenum (Mo), tungsten (W), nickel (Ni), gold (Au), palladium (Pd), platinum (Pt), silver (Ag), and tin (Sn); alloys such as ITO and IZO; polyacetylene conductive polymers, polyphenylene conductive polymers such as poly(p-phenylene) and derivatives thereof and polyphenylene vinylene and derivatives thereof; heterocyclic conductive polymers such as polypyrrol and derivatives thereof, polythiophene and derivatives thereof, and polyfuran and derivatives thereof; and ionic conductive polymers such as polyaniline and derivatives thereof. These materials may be used in combination. Furthermore, electric conductivity may be increased by doping conductive polymers with a dopant. Preferably, the dopant is a compound having a low vapor pressure such as polysulfonic acid, polystyrenesulfonic acid, naphthalenesulfonic acid and alkyl naphthalenesulfonic acid.

Preferably, the volume resistivity of the insulation layer 103 is $1 \times 10^{13}$ Ω·cm or greater, and more preferably, it is $1 \times 10^{14}$ Ω·cm or greater.

In forming the insulation layer 103, examples of materials of the insulation layer 103 can include inorganic insulation materials such as $SiO_2$, $Ta_2O_5$, and $Al_2O_3$ and organic insulation materials such as polyimide, styrene resin, polyethylene resin, polypropylene, vinyl chloride resin, polyester alkyd resin, polyamide, polyurethane, polycarbonate, polyarylate, polysulfone, diallyl phthalate resin, polyvinyl butyral resin, polyether resin, polyester, acrylic resin, silicon resin, epoxy resin, phenolic resin, urea resin, melamine resin, fluorine resins such as PFA, PTFE, and PVDF, parylene resin, photocurable resin such as epoxy acrylate, and urethane-acrylate, and polysaccharides such as pullulan and cellulose and derivatives thereof.

The insulation layer 103 can be formed by a thermal oxidation method, an anodic oxidation method, a vacuum film formation process such as deposition, spattering, and CVD, a printing method using a relief printing plate, flexographic printing, a printing method using a stencil printing plate, screen printing, a printing method using a planographic plate, offset printing, a printing method using an intaglio plate, gravure printing, and ink jet printing, and a printing method such as a spin coat method, a dipping method, and a spray coat method. Preferably, the anodic oxidation method is used in terms of simplicity of a processing device when oxides of the materials constituting the gate electrode 102 are used as insulation materials.

In forming the semiconductor materials 105, examples of materials of the semiconductor layer 105 can include organic semiconductor materials such as fluorene and derivatives thereof, fluorenone and derivatives thereof, poly(N-vinylcarbazole) derivatives, polyglutamic acid γ-carbazole ethyl derivatives, polyvinyl phenanthrene derivatives, polysilane derivatives, oxazole derivatives, oxadiazole derivatives, imidazole derivatives, allylamine derivatives such as monoarylamine and triarylamine derivatives, benzidine derivatives, diarylmethane derivatives, triarylmethane derivatives, styrylanthracene derivatives, pyrazoline derivatives, divinylbenzen derivatives, hydrazone derivatives, indene derivatives, indenone derivatives, butadiene derivatives, pyrene derivatives such as pyrene-formaldehyde and polyvinylpyrene, stilbene derivatives such as α-phenylstilbene derivatives and bisstilbene derivatives, enamine derivatives, thiophene derivatives such as polyalkyl thiophene, pentacene, tetracene, bisazo dye, trisazo dye, polyazo dye, triarylmethane dye, thiazine dye, oxazine dye, xanthene dye, cyanine dye, styryl dye, pyrylium dye, quinacridone dye, indigo dye, perylene dye, polycyclic quinine dye, bisbenzimidazole dye, indanthrone dye, squarylium dye, anthraquinone dye, and phthalocyanine dye such as copper phthalocyanine and titanyl phthalocyanine, inorganic semiconductor materials such as CdS, ZnO, PbTe, PbSnTe, InGaZnO, GaP, GaAlAs, and GaN, and silicone semiconductor materials such as polysilicon and amorphous silicon.

Figure 1:
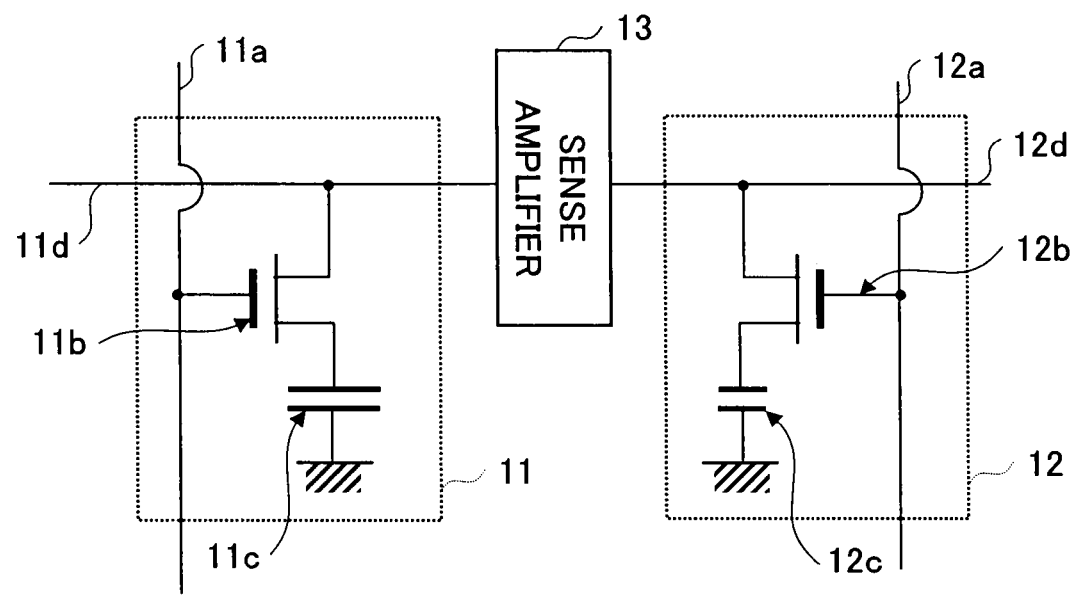
FIG. 1 shows a configuration of the memory cell of a DRAM.
Figure 2:
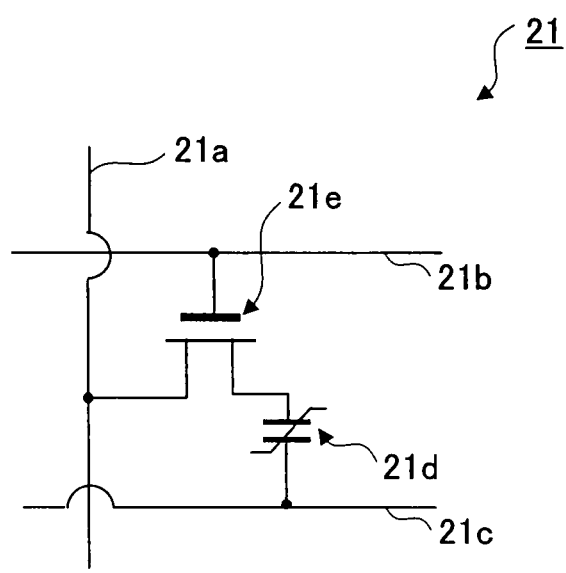
FIG. 2 shows a configuration of the cell of a FRAM.

The dielectric body 107 may be either ferroelectric or paraelectric. When a ferroelectric material is used as the dielectric body 107, a non-volatile memory device is provided. When a paraelectric material is used as the dielectric body 107, a volatile memory device is provided. Note that the principle of operation of these memory devices is similar to that of the memory devices shown in FIGS. 1 through 3.

Examples of ferroelectrics include inorganic ferroelectric materials such as PZT ($PbZr_xTi_{1-x}O_3$) (wherein 0<x<1), SBT ($SrBi_2Ta_2O_9$), $BaTiO_3$, $KNbO_3$—$NaNbO_3$, and ($Bi_{1/2}Na_{1/2}$) and organic ferroelectric materials such as vinylidene fluoride, phenazine-chloranilic acid, and phenazine-bromanilic acid.

Furthermore, examples of paraelectrics include inorganic paraelectric materials such as forsterite, aluminum oxide, barium magnesate niobate, barium neodynmate titanate, and calcium strontium titanate zicronate; and organic paraelectric materials such as polyimide, styrene resin, polyethylene resin, polypropylene, vinyl chloride resin, polyester alkyd resin, polyamide, polyurethane, polycarbonate, polyalylate, polysulfone, diallyl phthalate resin, polyvinyl butyral resin, polyether resin, polyester resin, acrylic resin, silicone resin, epoxy resin, phenolic resin, urea resin, melamine resin, fluorine resin such as PFA and PTFE, parylene resin, epoxy acrylate, and urethane-acrylate.

FIGS. 8A through 8F show a method of manufacturing the memory device 100A. First, the gate electrode 102 is formed on the substrate 101 (see FIG. 8A). Next, the front surface of the gate electrode 102 is covered with the insulation layer 103 to form a convex portion (see FIG. 8B). Moreover, an electrode pattern 104 is formed in an area including the convex portion on the substrate 101 (see FIG. 8C). Then, the electrode pattern 104 formed on the side surfaces of the convex portion is removed by etching so as to form the source electrode 104a, the conductive layer 104b, and the drain electrode 104c (see FIG. 8D). After this, the lower electrode 106b, the dielectric body 107, and the upper electrode 106a are laminated on the substrate 101 to form a capacitor (see FIG. 8E). Then, the semiconductor layer 105 is formed on the insulation layer 103 existing between the source electrode 104a and the conductive layer 104b and between the conductive layer 104b and the drain electrode 104c, which are divided by the bump of the convex portion (see FIG. 8F).

Figure 9:
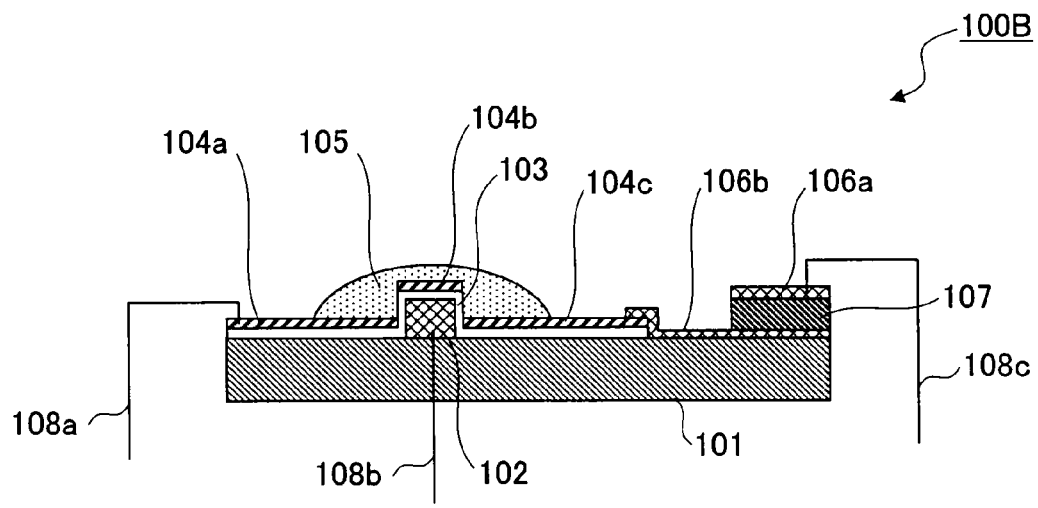
FIG. 9 shows a modified embodiment of the memory device in FIG. 7.

Note that, in the memory device 100A, the insulation layer 103 may be formed between the substrate 101 and the source electrode 104a and between the substrate 101 and the drain electrode 104c as in a memory device 100B (see FIG. 9). Furthermore, the semiconductor layer 105 may not be formed on the conductive layer 104b.

Figure 10:
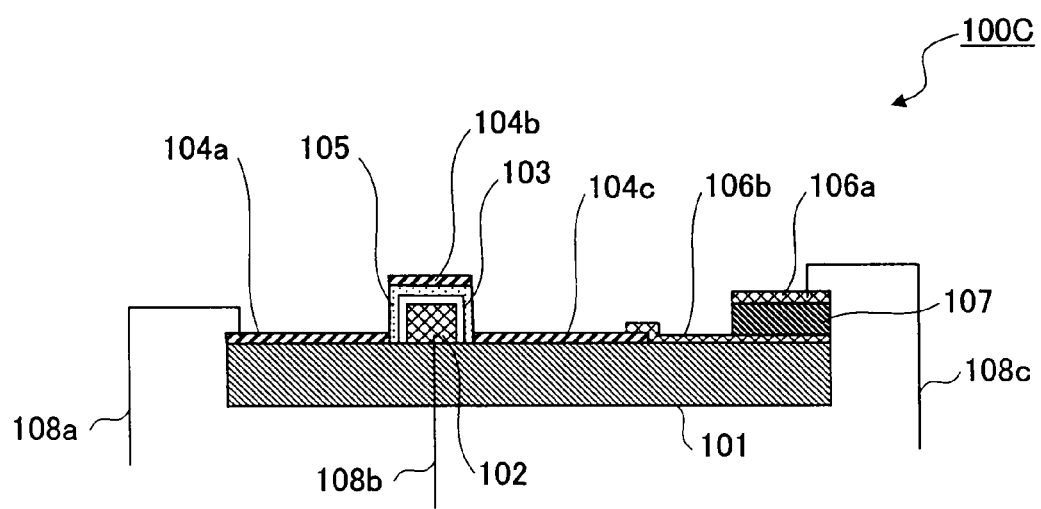
FIG. 10 shows a second embodiment of the memory device according to the present invention.

FIG. 10 shows a second embodiment of the memory device according to the present invention. In FIGS. 10 through 23, the same reference numerals are used to describe those components that are identical to the components in FIGS. 7 through 9. In a memory device 100C, the insulation layer 103 and the semiconductor layer 105 are laminated on the substrate 101 one upon the other to form a convex portion that covers the front surface of the gate electrode 102. Also, an electrode pattern is formed in an area including the convex portion on the substrate 101, and the bump of the convex portion divides the electrode pattern into the conductive layer 104b formed at the top of the convex portion, and the source electrode 104a and the drain electrode 104c formed on both sides of the convex portion. Note that the source electrode 104a, the conductive layer 104b, and the drain electrode 104c are electrode layers that are formed separately and each constitutes an independent area. The memory device 100C includes a transistor having the above configuration and a capacitor having the dielectric body 107 held between the upper electrode 106a and the lower electrode 106b. Accordingly, the memory device capable of achieving a low error rate, responding at high speed, and being manufactured at low cost can be provided.

Note that the gate electrode 102, the source electrode 104a and the drain electrode 104c, and the upper electrode 106a and the lower electrode 106b are connected to the word line 108b, the bit line 108a, and the plate line 108c, respectively, and the plate line 108c is given a fixed potential or driven by a pulse. Furthermore, the drain electrode 104c and the lower electrode 106b may be integrally molded.

FIGS. 11A through 11F show a method of manufacturing the memory device 100C. First, the gate electrode 102 is formed on the substrate 101 (see FIG. 11A). Next, the front surface of the gate electrode 102 is covered with the insulation layer 103 (see FIG. 11B). In addition, the front surface of the insulation layer 103 is covered with the semiconductor layer 105 to form a convex portion (see FIG. 11C). Moreover, the electrode pattern 104 is formed in an area including the convex portion on the substrate 101 (see FIG. 11D). Then, the electrode pattern 104 formed on the side surfaces of the convex portion is removed by etching so as to form the source electrode 104a, the conductive layer 104b, and the drain electrode 104c (see FIG. 11E). After this, the lower electrode 106b, the dielectric body 107, and the upper electrode 106a are laminated on the substrate 101 to form a capacitor (see FIG. 11F).

Figure 12:
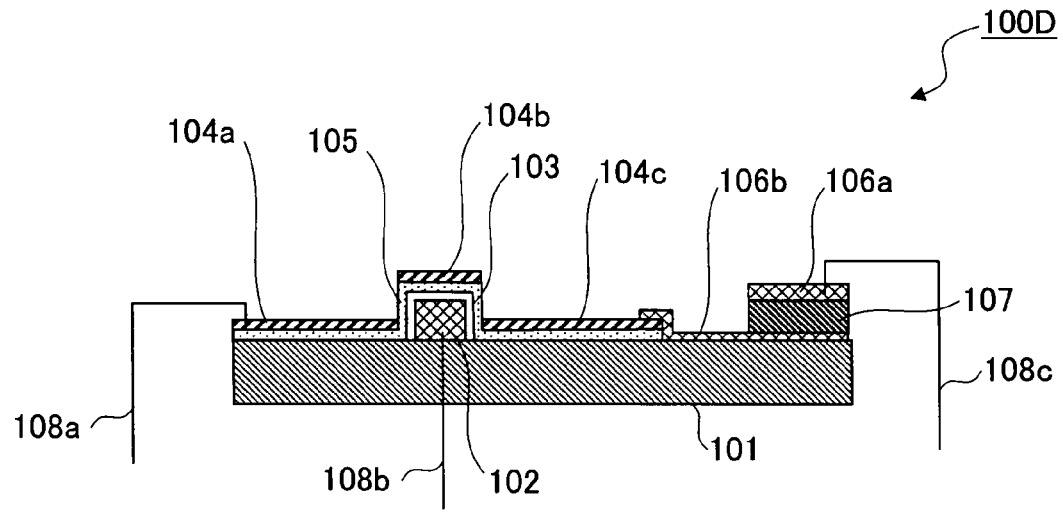
FIG. 12 shows a modified embodiment of the memory device in FIG. 10.

Note that, in the memory device 100C, the semiconductor layer 105 may be formed between the substrate 101 and the source electrode 104a and between the substrate 101 and the drain electrode 104c as in a memory device 100D (see FIG. 12). Furthermore, in the memory device 100C, the insulation layer 103 may be formed between the substrate 101 and the source electrode 104a and between the substrate 101 and the drain electrode 014c as in the memory device 100B.

Figure 13:
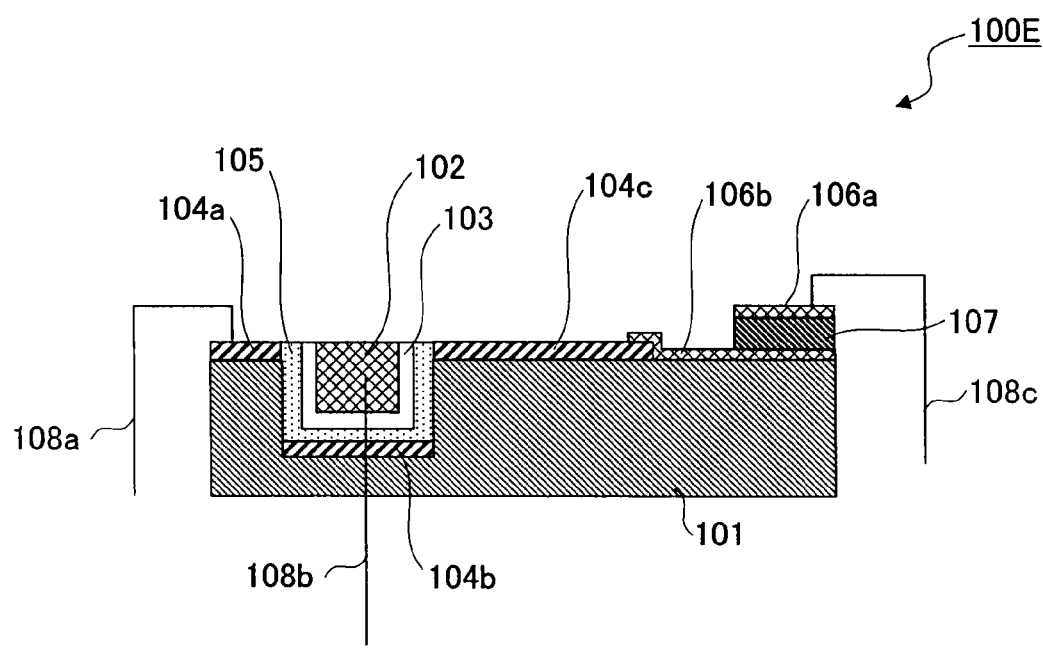
FIG. 13 shows a third embodiment of the memory device according to the present invention.

FIG. 13 shows a third embodiment of the memory device according to the present invention. A memory device 100E has a concave portion formed in the substrate 101. Also, an electrode pattern is formed in an area including the concave portion on the substrate 101, and the bump of the concave portion divides the electrode pattern into the conductive layer 104b formed at the bottom of the concave portion, and the source electrode 104a and the drain electrode 104c formed on both sides of the concave portion. Note that the source electrode 104a, the conductive layer 104b, and the drain electrode 104c are electrode layers that are formed separately and each constitutes an independent area. Furthermore, the concave portion having the conductive layer 104b is covered with the semiconductor layer 105, the insulation layer 103, and the gate electrode 102 laminated one upon another. The memory device 100E includes a transistor having the above configuration and a capacitor having the dielectric body 107 held between the upper electrode 106a and the lower electrode 106b. Accordingly, the memory device capable of achieving a low error rate, responding at high speed, and being manufactured at low cost can be provided.

Note that the gate electrode 102, the source electrode 104a and the drain electrode 104c, and the upper electrode 106a and the lower electrode 106b are connected to the word line 108b, the bit line 108a, and the plate line 108c, respectively, and the plate line 108c is given a fixed potential or driven by a pulse. Furthermore, the drain electrode 104c and the lower electrode 106b may be integrally molded.

FIGS. 14A through 14F show a method of manufacturing the memory device 100E. First, after the electrode pattern is formed in the area including the concave portion on the substrate 101, the electrode pattern formed on both sides of the concave portion is removed by etching so as to form the source electrode 104a, the conductive layer 104b, and the drain electrode 104c (see FIG. 14A). Next, the semiconductor layer 105 is formed in the area including the concave portion on the substrate 101 having the source electrode, the conductive layer 104b, and the drain electrode 104c (see FIG. 14B). In addition, the insulation layer 103 is formed on the semiconductor layer 105 (see FIG. 14C). Then, the gate electrode 102 is formed on the insulation layer 103 (see FIG. 14D). After this, the gate electrode 102, the insulation layer 103, and the semiconductor layer 105 formed in an area other than the concave portion are removed by surface polishing (see FIG. 14E). Then, the lower electrode 106b, the dielectric body 107, and the upper electrode 106a are laminated on the substrate 101 to form a capacitor (see FIG. 14F).

Note that, in the memory device 100E, the semiconductor layer 105 may be formed on the source electrode 104a and the drain electrode 104c, and the insulation layer 103 may additionally be formed on the semiconductor layer 103.

Figure 15:
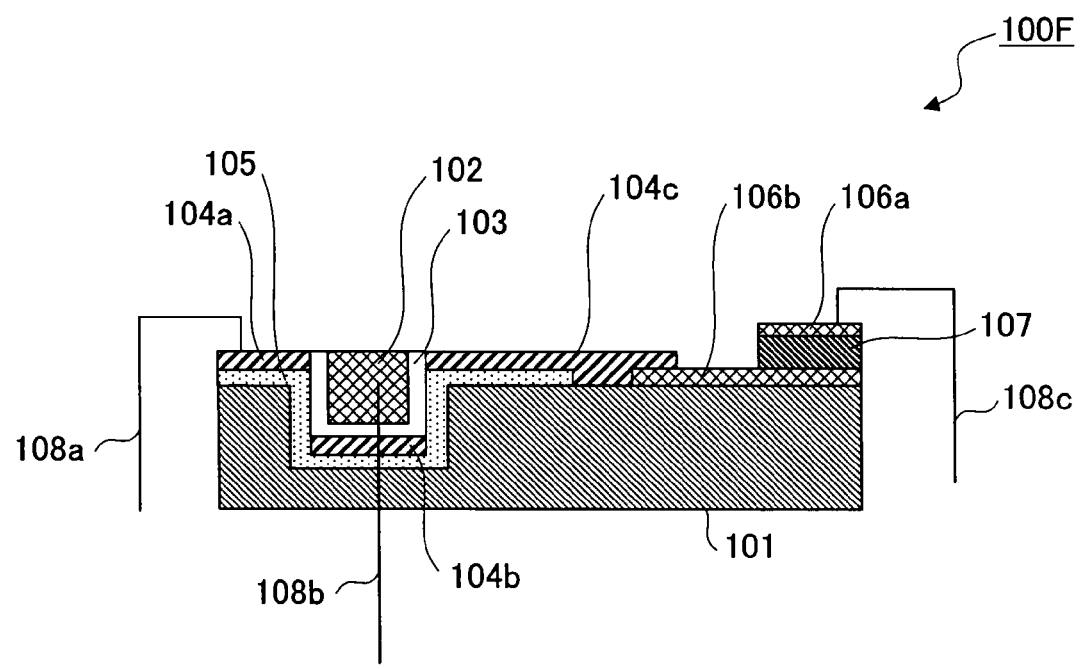
FIG. 15 shows a fourth embodiment of the memory device according to the present invention.

FIG. 15 shows a fourth embodiment of the memory device according to the present invention. A memory device 100F has a characteristics 101. Also, the semiconductor layer 105 is formed in an area including the concave portion on the substrate 101. In addition, an electrode pattern is formed in the area including the concave portion on the substrate 101 having the semiconductor layer 105, and the bump of the concave portion divides the electrode pattern into the conductive layer 104b formed at the bottom of the concave portion, and the source electrode 104a and the drain electrode 104c formed on both sides of the concave portion. Note that the source electrode 104a, the conductive layer 104b, and the drain electrode 104c are electrode layers that are formed separately and each constitutes an independent area. Furthermore, the concave portion having the conductive layer 104b is covered with the semiconductor layer 105, the insulation layer 103, and the gate electrode 102 laminated one upon another. The memory device 100F includes a transistor having the above configuration and a capacitor having the dielectric body 107 held between the upper electrode 106a and the lower electrode 106b. Accordingly, the memory device capable of achieving a low error rate, responding at high speed, and being manufactured at low cost can be provided.

Note that the gate electrode 102, the source electrode 104a and the drain electrode 104c, and the upper electrode 106a and the lower electrode 106b are connected to the word line 108b, the bit line 108a, and the plate line 108c, respectively, and the plate line 108c is given a fixed potential or driven by a pulse. Furthermore, the drain electrode 104c and the lower electrode 106b may be integrally molded.

FIGS. 16A through 16F show a method of manufacturing the memory device 100F. First, the semiconductor layer 105 is formed in the area including the concave portion on the substrate 101 (see FIG. 16A). Next, after the electrode pattern is formed in the area including the concave portion on the substrate 101 having the semiconductor layer 105, the electrode pattern formed on both sides of the concave portion is removed by etching so as to form the source electrode 104a, the conductive layer 104b, and the drain electrode 104c (see FIG. 16B). Then, the insulation layer 103 is formed in the area including the concave portion on the substrate 101 having the source electrode 104a, the conductive layer 104b, and the drain electrode 104c (see FIG. 16C). After this, the gate electrode 102 is formed on the insulation layer 103 (FIG. 16D). Then, the gate electrode 102, the insulation layer 103 formed in an area other than the concave portion are removed by surface polishing (see FIG. 16E). In addition, the lower electrode 106b, the dielectric body 107, and the upper electrode 106a are laminated on the substrate 101 to form a capacitor (FIG. 16F).

Note that, in the memory device 100F, the semiconductor layer 105 may be formed only in the concave portion, and the insulation layer 103 may additionally be formed on the source electrode 104a and the drain electrode 104c.

Figure 17:
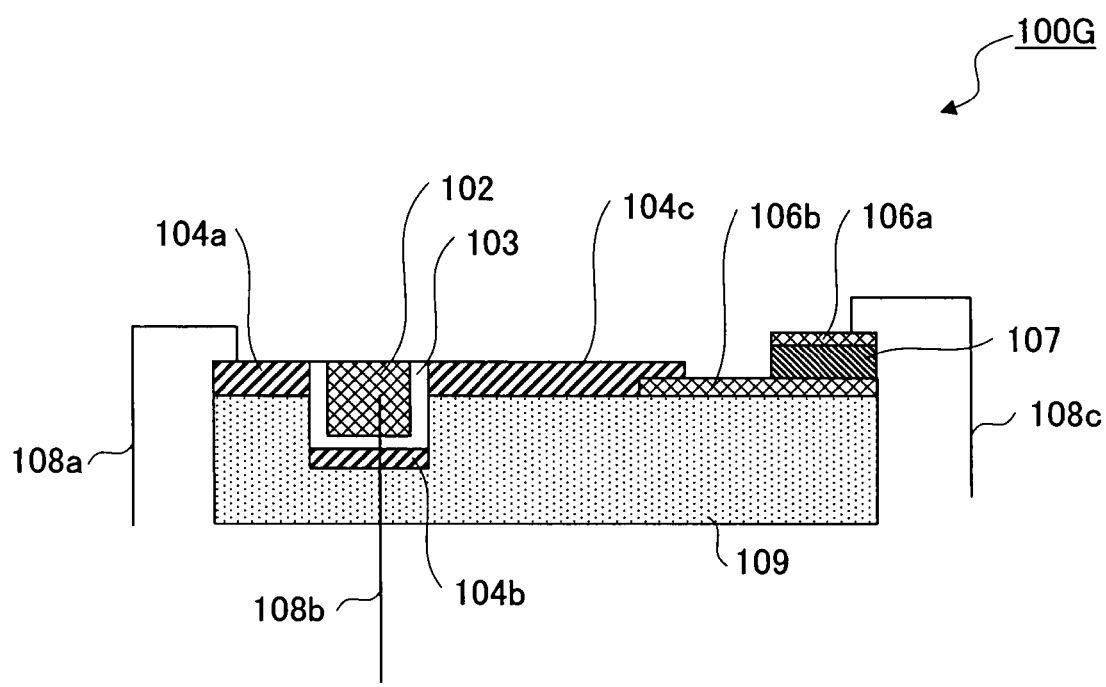
FIG. 17 shows a fifth embodiment of the memory device according to the present invention.

FIG. 17 shows a fifth embodiment of the memory device according to the present invention. A memory device 100G has a concave portion formed on a semiconductor substrate 109. Also, an electrode pattern is formed in an area including the concave portion on the semiconductor substrate 109, and the bump of the concave portion divides the electrode pattern into the conductive layer 104b formed at the bottom of the concave portion, and the source electrode 104a and the drain electrode 104c formed on both sides of the concave portion. Note that the source electrode 104a, the conductive layer 104b, and the drain electrode 104c are electrode layers that are formed separately and each constitutes an independent area. Furthermore, the concave portion having the conductive layer 104b is covered with the insulation layer 103 and the gate electrode 102 laminated one upon the other. The memory device 100G includes a transistor having the above configuration and a capacitor having the dielectric body 107 held between the upper electrode 106a and the lower electrode 106b. Accordingly, the memory device capable of achieving a low error rate, responding at high speed, and being manufactured at low cost can be provided.

Note that the gate electrode 102, the source electrode 104a and the drain electrode 104c, and the upper electrode 106a and the lower electrode 106b are connected to the word line 108b, the bit line 108a, and the plate line 108c, respectively, and the plate line 108c is given a fixed potential or driven by a pulse. Furthermore, the drain electrode 104c and the lower electrode 106b may be integrally molded.

FIGS. 18A through 18F show a method of manufacturing the memory device 100G. First, the concave portion is formed in the semiconductor substrate 109 (see FIG. 18A). Next, after the electrode pattern is formed in the area including the concave portion on the semiconductor substrate 109, the electrode pattern formed on both sides of the concave portion is removed by etching so as to form the source electrode 104a, the conductive layer 104b, and the drain electrode 104c (see FIG. 18B). Then, the insulation layer 103 is formed in the area including the concave portion on the semiconductor substrate 109 having the source electrode 104a, the conductive layer 104b, and the drain electrode 104c (see FIG. 18C). After this, the gate electrode 102 is formed on the insulation layer 103 (see FIG. 18D). Then, the gate electrode 102 and the insulation layer 103 formed in an area other than the concave portion are removed by surface polishing (see FIG. 18E). In addition, the lower electrode 106b, the dielectric body 107, and the upper electrode 106a are laminated on the semiconductor substrate 109 to form a capacitor (see FIG. 18F).

Note that, in the memory device 100G, the insulation layer 103 may be formed on the source electrode 104a and the drain electrode 104c.

Figure 19:
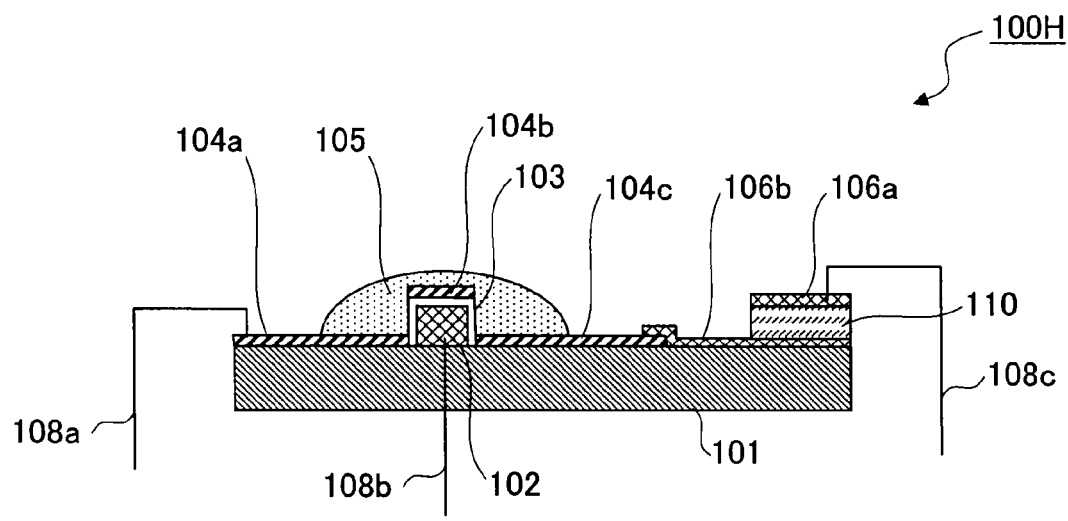
FIG. 19 shows a sixth embodiment of the memory device according to the present invention.

FIG. 19 shows a sixth embodiment of the memory device according to the present invention. Note that a memory device 100H is identical to the memory device 100A except that it uses a material 110 whose electric resistance is changed with the application of voltage instead of the dielectric body 107. Accordingly, the memory device capable of achieving a low error rate, responding at high speed, and being manufactured at low cost can be provided. Note that the memory device 100H can be manufactured in the same manner as the memory device 100A.

Figure 20:
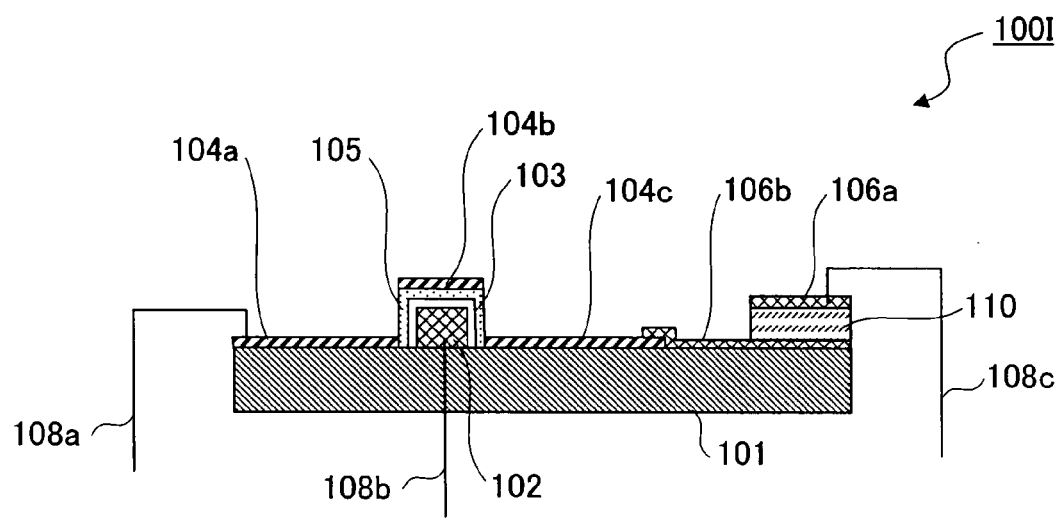
FIG. 20 shows a seventh embodiment of the memory device according to the present invention.

FIG. 20 shows a seventh embodiment of the memory device according to the present invention. Note that a memory device 100I is identical to the memory device 100C except that it uses the material 110 whose electric resistance is changed with the application of voltage instead of the dielectric body 107. Accordingly, the memory device capable of achieving a low error rate, responding at high speed, and being manufactured at low cost can be provided. Note that the memory device 100I can be manufactured in the same manner as the memory device 100C.

Figure 21:
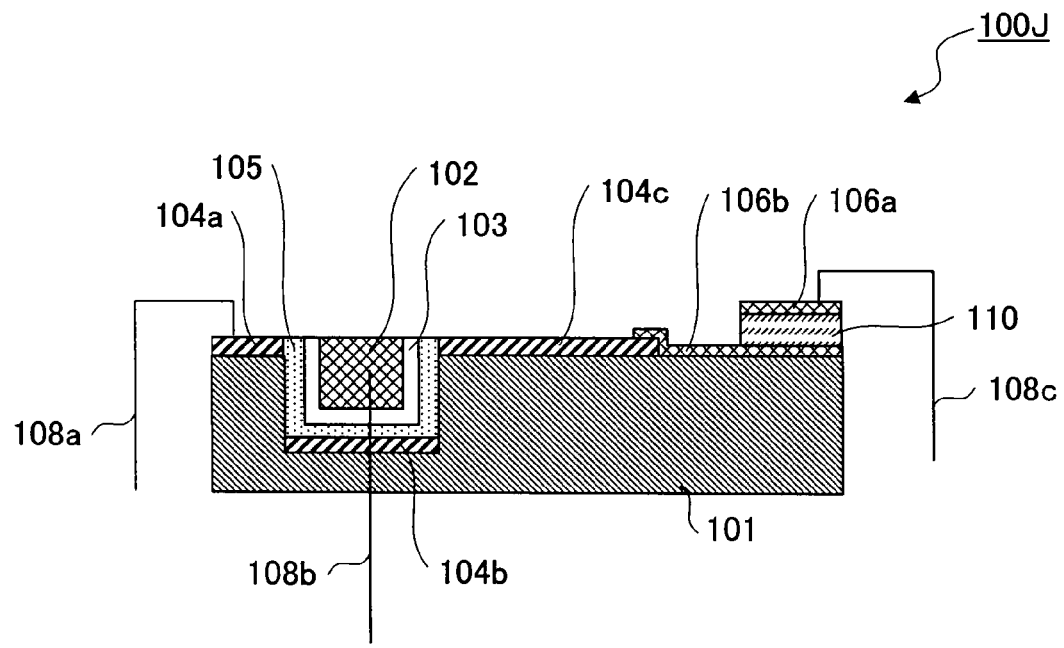
FIG. 21 an eighth embodiment of the memory device according to the present invention.

FIG. 21 shows an eighth embodiment of the memory device according to the present invention. Note that a memory device 100J is identical to the memory device 100E except that it uses the material 110 whose electric resistance is changed with the application of voltage instead of the dielectric body 107. Accordingly, the memory device capable of achieving a low error rate, responding at high speed, and being manufactured at low cost can be provided. Note that the memory device 100J can be manufactured in the same manner as the memory device 100E.

Figure 22:
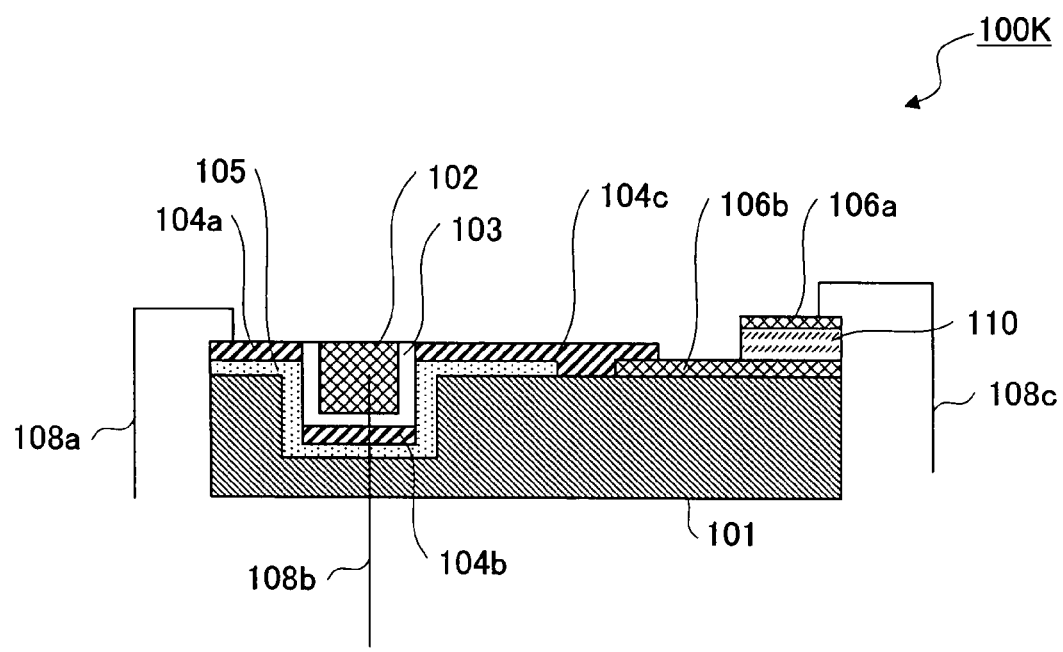
FIG. 22 shows a ninth embodiment of the memory device according to the present invention.

FIG. 22 shows a ninth embodiment of the memory device according to the present invention. Note that a memory device 100K is identical to the memory device 100F except that it uses the material 110 whose electric resistance is changed with the application of voltage instead of the dielectric body 107. Accordingly, the memory device capable of achieving a low error rate, responding at high speed, and being manufactured at low cost can be provided. Note that the memory device 100K can be manufactured in the same manner as the memory device 100F.

Figure 23:
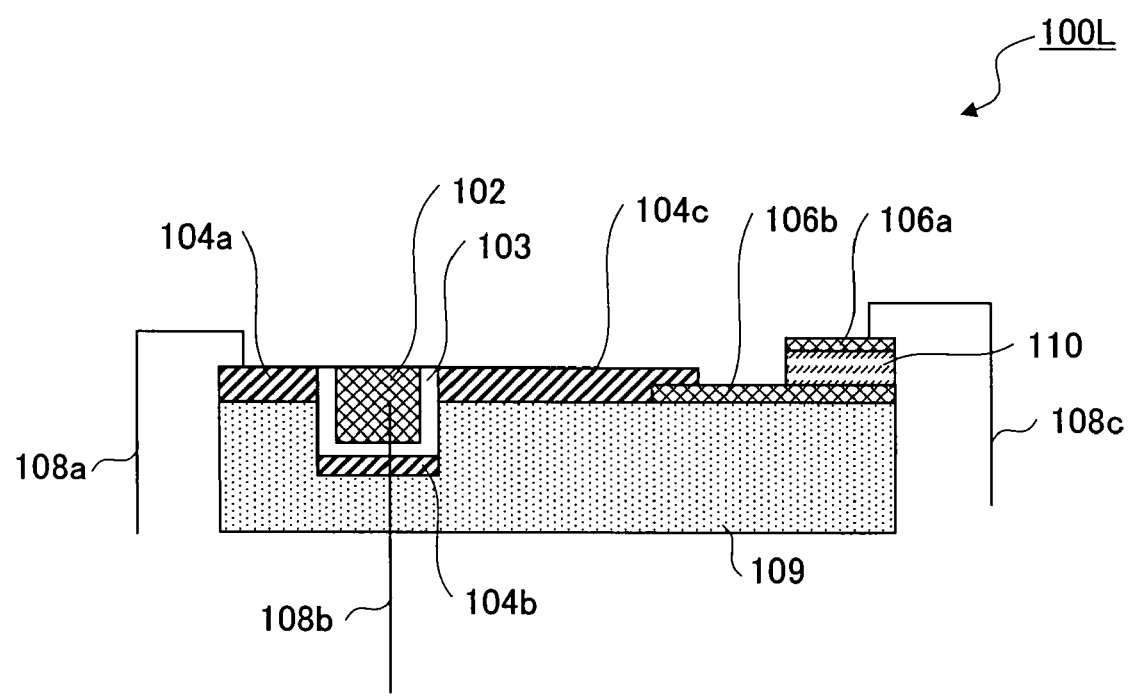
FIG. 23 shows a tenth embodiment of the memory device according to the present invention.

FIG. 23 shows a tenth embodiment of the memory device according to the present invention. Note that a memory device 100L is identical to the memory device 100G except that it uses the material 110 whose electric resistance is changed with the application of voltage instead of the dielectric body 107. Accordingly, the memory device capable of achieving a low error rate, responding at high speed, and being manufactured at low cost can be provided. Note that the memory device 100L can be manufactured in the same manner as the memory device 100G.

The material 110 whose electric resistance is changed with the application of voltage is preferably a phase-change material. Accordingly, a high integration non-volatile memory device can be provided. An example of the phase-change material includes a material disclosed in JP-A-2006-120810, but it is preferably a ternary phase-change material such as Ge—Sb—Te and a quaternary phase-change material such as Ag—In—Sb—Te.

Figure 4:
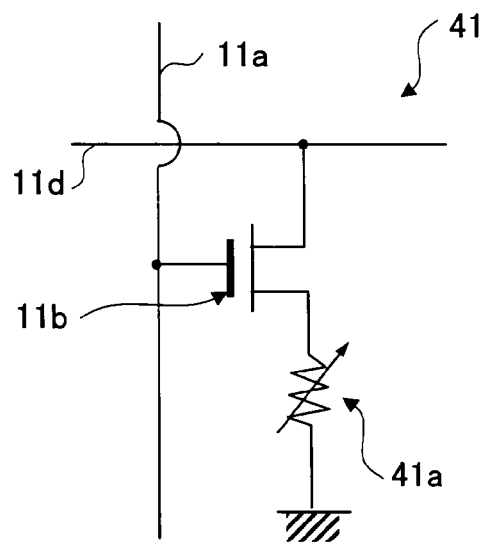
FIG. 4 shows a configuration of the memory cell of a PRAM.

Note that the principle of operation of the memory devices 10H through 10L is similar to that of the memory device shown in FIG. 4.

EXAMPLES

Example 1

Figure 24:
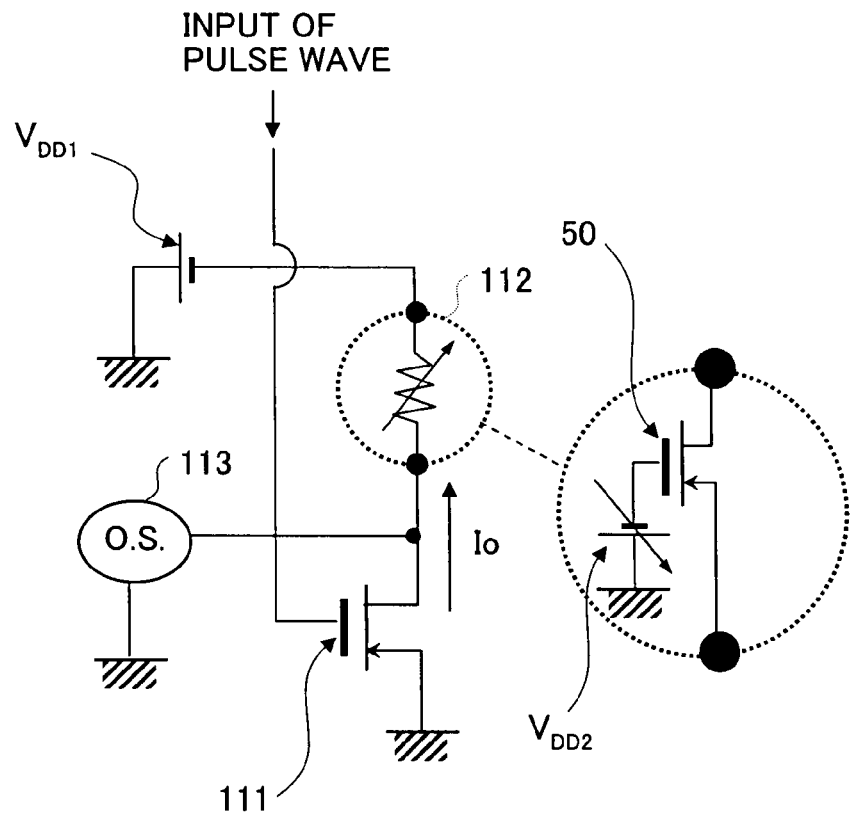
FIG. 24 shows a configuration of a pseudo memory cell in Example 1.
Figure 25:
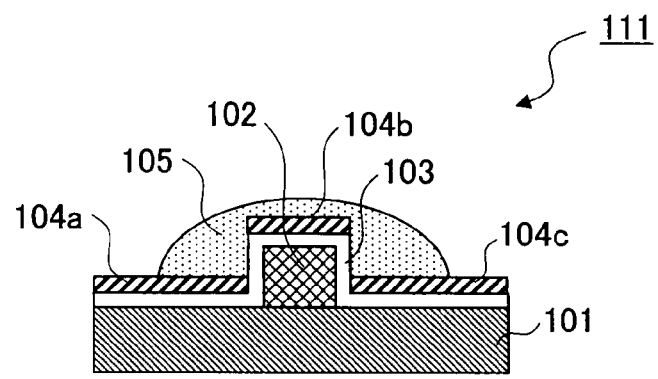
FIG. 25 shows a transistor in Example 1.

A pseudo memory cell (see FIG. 24) having a transistor 111, a variable resistor 112, and an oscilloscope 113 is manufactured, and its electric characteristics are evaluated.

The transistor 111 has the same configuration as that of the transistor in FIG. 7 and has a channel length of 2 µm. In this case, the substrate 101 is a glass substrate, the gate electrode 102 is made of Al, the insulation layer 103 is made of parylene C, the source electrode 104a, the conductive layer 104b, and the drain electrode 104c are made of Au, and the semiconductor layer 105 is made of pentacene.

Figure 5:
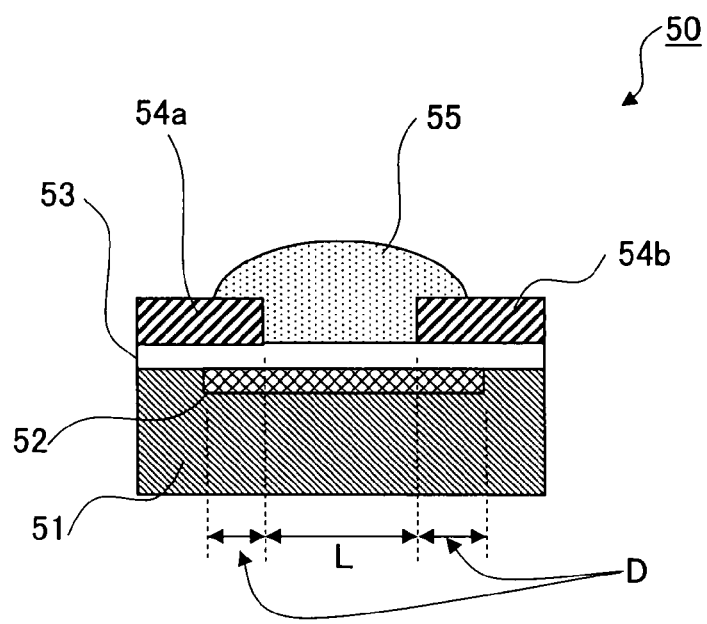
FIG. 5 shows a general structure of a (planar-type) transistor.
Figure 6:
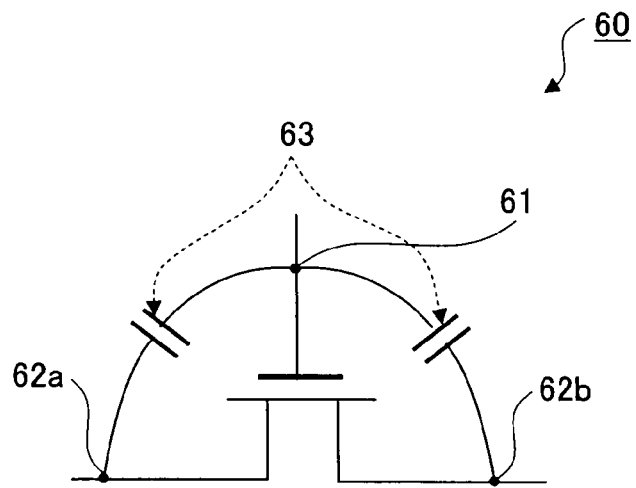
FIG. 6 shows an equivalent circuit of a transistor having a gate overlap.

The variable resistor 112 corresponds to the phase-change material 41a in FIG. 4, and the transistor 50 (see FIG. 5) can hold a predetermined electric resistance with the application of gate voltage $V_{DD2}$ and has a channel length of 5 µm and a gate overlap D of 30 µm. In this case, the substrate 51 is a glass substrate, the gate electrode 52 is made of Al, the gate insulation film 53 is made of parylene C, the source electrode 54a and the drain electrode 54b are made of Au, and the semiconductor layer 55 is made of pentacene.

Note that current $I_o$ shows a voltage ratio displayed by the oscilloscope 113 relative to the electric resistance of the variable resistor 112.

Furthermore, when the electric characteristics are evaluated, $V_{DD1}$ is set to −10 V and $V_{DD2}$ is set to either −10 V or 0 V. Here, when $V_{DD2}$ is set to −10 V, the electric resistance of the variable resistor 112 is 1 kΩ. When $V_{DD2}$ is set to 0 V, it is 100 kΩ. Moreover, the frequencies of pulse waves (rectangular waves from −10 V to 0 V) are swept up to 1 kHz through 1 MHz and input, and the waveforms displayed by the oscilloscope 113 are observed to evaluate the electric characterization. Note that, in the evaluation of the electric characterization, a complete rectangular waveform is indicated as ⊙, a nearly rectangular waveform is indicated as ○, a deformed rectangular waveform is indicated as Δ, and a non-rectangular waveform is indicated as X. Evaluation results are shown in table 3.

Comparative Example 1

The electrical characteristics of the pseudo memory cell are evaluated in the same manner as Example 1 except that the transistor 50 is used instead of the transistor 111.

The present invention is not limited to the specifically disclosed embodiments, but variations and modifications may be made without departing from the scope of the present invention.

The present application is based on Japanese Priority Application No. 2007-172832 filed on Jun. 29, 2007, the entire contents of which are hereby incorporated herein by reference.

What is claimed is:

1. A memory device having a transistor, the transistor including:
a substrate;
a gate electrode formed on the substrate;
an insulation layer formed on the gate electrode, the gate electrode and the insulation layer forming a convex portion;
a conductive layer formed at a top of the convex portion;
a source electrode formed on one side of the convex portion on the substrate;
a drain electrode formed on the other side of the convex portion on the substrate where the source electrode is not formed; and
a semiconductor layer formed on the insulation layer existing between the conductive layer and the source electrode and between the conductive layer and the drain electrode,
wherein the source electrode, the conductive layer, and the drain electrode, which are divided by a bump of the convex portion, are electrode layers constituting independent areas separated from one another.

2. A memory device having a transistor, the transistor including:
a substrate;
a concave portion formed in the substrate;
a source electrode formed on one side of the concave portion on the substrate;
a drain electrode formed on the other side of the concave portion on the substrate where the source electrode is not formed;
a semiconductor layer covering the concave portion;
a conductive layer formed at a bottom of the semiconductor layer;
an insulation layer formed on the conductive layer; and
a gate electrode formed on the insulation layer, the insulation layer and the gate electrode being laminated one upon the other to cover the semiconductor layer having the conductive layer,
wherein the source electrode, the conductive layer, and the drain electrode, which are divided by a bump of the

TABLE 3

| | | FREQUENCY OF PULSE WAVE | | | | | | | | | |
|---|---|---|---|---|---|---|---|---|---|---|---|
| | | 1 kHz | 5 kHz | 10 kHz | 20 kHz | 40 kHz | 100 kHz | 200 kHz | 400 kHz | 600 kHz | 800 kHz | 1 MHz |
| EXAMPLE 1 | $V_{DD2}$ = −10 V | ⊙ | ⊙ | ⊙ | ⊙ | ⊙ | ⊙ | ⊙ | ⊙ | ⊙ | ○ | ○ |
| | $V_{DD2}$ = −0 V | ⊙ | ⊙ | ○ | Δ | x | x | — | — | — | — | — |
| COMPARATIVE EXAMPLE 1 | $V_{DD2}$ = −10 V | x | x | — | — | — | — | — | — | — | — | — |
| | $V_{DD2}$ = −0 V | x | x | — | — | — | — | — | — | — | — | — |

It is clear from table 3 that the pseudo memory cell in Example 1 can achieve a low error rate and respond at high speed.

convex portion, are electrode layers constituting independent areas separated from one another.

3. A memory device having a transistor, the transistor including:

a semiconductor substrate;

a concave portion formed in the semiconductor substrate;

a source electrode formed on one side of the concave portion on the semiconductor substrate;

a drain electrode formed on the other side of the concave portion on the semiconductor substrate where the source electrode is not formed;

a conductive layer formed at a bottom of the concave portion;

an insulation layer formed on the conductive layer; and a gate electrode formed on the insulation layer, the insulation layer and the gate electrode being laminated one upon the other to cover the concave portion having the conductive layer, wherein the source electrode, the conductive layer, and the drain electrode, which are divided by a bump of the convex portion, are electrode layers constituting independent areas separated from one another.

4. The memory device according to claim 1, further including:

a capacitor having a dielectric body.

5. The memory device according to claim 4, wherein the dielectric body is a ferroelectric.

6. The memory device according to claim 4, wherein the dielectric body is a paraelectric.

7. The memory device according to claim 1, further including:

an element whose electric resistance is changed with an application of voltage.

8. The memory device according to claim 7, wherein the element whose electric resistance is changed with the application of voltage has a phase-change material.

* * * * *